US007359521B1

(12) United States Patent
Absar et al.

(10) Patent No.: US 7,359,521 B1
(45) Date of Patent: Apr. 15, 2008

(54) ALIASING CANCELLATION IN AUDIO EFFECTS ALGORITHMS

(75) Inventors: Mohammed Javed Absar, Singapore (SG); Sapna George, Singapore (SG); Antonio Mario Alvarez-Tinoco, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 10/148,095

(22) PCT Filed: Nov. 24, 1999

(86) PCT No.: PCT/SG99/00129

§ 371 (c)(1), (2), (4) Date: Nov. 8, 2002

(87) PCT Pub. No.: WO01/39171

PCT Pub. Date: May 31, 2001

(51) Int. Cl.
*H04B 15/00* (2006.01)
*H03G 5/00* (2006.01)

(52) U.S. Cl. ...................... 381/94.2; 381/98; 708/322; 379/406.08

(58) Field of Classification Search ............... 381/94.1, 381/94.2, 94.3, 94.7, 94.8, 98, 63, 2, 101, 381/102, 71.11; 708/322; 379/406.8, 406.12
See application file for complete search history.

(56) References Cited

U.S. PATENT DOCUMENTS

| | | | | |
|---|---|---|---|---|
| 4,607,642 | A * | 8/1986 | Powers | 600/455 |
| 4,942,799 | A | 7/1990 | Suzuki | 84/603 |
| 5,648,778 | A | 7/1997 | Linz et al. | 341/110 |
| 5,789,689 | A | 8/1998 | Doidie et al. | 84/603 |
| 5,814,750 | A | 9/1998 | Wang et al. | 84/602 |
| 5,815,580 | A * | 9/1998 | Craven et al. | 381/58 |
| 5,920,842 | A * | 7/1999 | Cooper et al. | 704/503 |
| 6,591,241 | B1 * | 7/2003 | Absar et al. | 704/504 |
| 2001/0000313 | A1 * | 4/2001 | Zhang | 381/7 |

FOREIGN PATENT DOCUMENTS

| | | |
|---|---|---|
| EP | 0 178 840 A1 | 4/1986 |
| EP | 0 474 177 A2 | 3/1992 |

* cited by examiner

*Primary Examiner*—Xu Mei
(74) *Attorney, Agent, or Firm*—Lisa K. Jorgenson; E. Russell Tarleton; Seed IP Law Group PLLC

(57) ABSTRACT

A method for effecting aliasing cancellation in an audio effects algorithm using a delay modulated signal, derived from interpolation of a delay modulator at an instantaneous sampling frequency, including: determining the instantaneous sampling frequency $1/T_{isf}$ and band limiting an input signal, to which the audio effects algorithm is to be applied to ½ $T_{isf}$ prior to interpolation.

10 Claims, No Drawings

ALIASING CANCELLATION IN AUDIO EFFECTS ALGORITHMS

BACKGROUND OF THE INVENTION

Field of the Invention

This invention is applicable in the field of Digital Audio Processing and, in particular, to aliasing cancellation in an audio effects algorithm.

Audio effects such as delay, echo, reverberation, flanging and chorus are indispensable in music production and performance. Most of these effects today are implemented using digital signal processors. The modulating delay line forms the basis of many of these standard audio effects. The "dry" input is mixed with the effect signal, which is usually a linear function of the modulating delay.

Delay modulators introduce interpolation and aliasing artifacts. Previously, DSP processor were limited in their processing power and so it was understandable that algorithms made no extra effort to correct such errors. However, today, processing power is becoming lesser and lesser the limiting factor. In such a setting it is important that high quality be achieved by removing all artifacts and distortion.

SUMMARY OF THE INVENTION

In accordance with the disclosed embodiment of the present invention, there is provided a method and apparatus for effecting aliasing cancellation in an audio effects algorithm using a delay modulated signal, derived from interpolation of a delay modulator at an instantaneous sampling frequency, including:

determining the instantaneous sampling frequency $1/T_{isf}$; and band limiting an input signal, to which the audio effects algorithm is to be applied, to ½ $T_{isf}$ prior to interpolation.

Preferably, the delay modulated signal of a sampled version x[n] of the band limited analogue signal x(t) is expressed as $$y[n]=x(\{n+D/2\sin(w_o n)\}T_s)$$

where n=integer

D=maximum delay $W_o$=oscillating frequency of the delay modulator; and $T_s$=1/sampling frequency.

Preferably, interpolation of the delay modulated signal y[n] is computed using $$y[n]=\sum_{k=-N}^{N} x[n'-k]\left[\frac{\sin[(\pi\Delta 1-kT_s)/T_{isf}]}{\pi(\Delta t-kT_s)/T_s}\right]$$

$$n'=INT(n+D/2\sin(w_o n))$$

$$\Delta t=[n+D/2\sin(w_o n)]T_s-n'T_s.$$

Preferably, the instantaneous sampling frequency, for a generalised modulating function g(n) is derived from $$T_{isf}=[1+g(n)-g(n-1)]T_s$$

In accordance with another aspect of the invention, a method of aliasing cancellation is provided that includes determining the instantaneous sampling frequency $1/T_{isf}$ for analogue input signal x(t);

band limiting the analogue input signal x(t) to ½ $T_{isf}$; and deriving a delay modulation signal of a sampled version x[n] of the band limited analogue signal by using the expression $$y[n]=x(\{n+D/2\sin(w_O n)\}T_S),$$

where n=integer

D=maximum delay $W_0$=oscillating frequency of the delay modulator; and $T_S$=1/sampling frequency.

In accordance with another aspect of the foregoing embodiment, the method further includes interpolating the delay modulation signal by using $$y[n]=\sum_{k^m-N}^{N} x[n'-k]\left[\frac{\sin[\pi\Delta 1-kT_s/T_{isf}]}{\pi(\Delta t-kT_s)/T_s}\right]$$

$$n'=INT(n+D/2\sin(w_o n))$$

$$\Delta t=[n+D/2\sin(w_o n)]T_s-n'T_s.$$

In accordance with yet another embodiment of the invention, an audio signal device for generating audio effects as provided that comprises:

a digital signal processor configured to carry out the following steps:

a method of aliasing cancellation is provided that includes determining the instantaneous sampling frequency $1/T_{isf}$ for an analogue input signal x(t);

band limiting the analogue input signal x(t) to ½ $T_{isf}$; and deriving a delay modulation signal of a sampled version x[n] of the band limited analogue signal by using the expression $$y[n]=x(\{n+D/\mathbf{2}\sin(w_O n\mathbf{0}\}T_S),$$

where n=integer

D=maximum delay $w_0$=oscillating frequency of the delay modulator; and $T_S$=1/sampling frequency.

DETAILED DESCRIPTION OF A PREFERRED EMBODIMENT

Consider a uniformly sampled version x[n] of the band-limited analog signal x(t). A single reflection or echo of the signal can be implemented by the following filter, which adds to the direct signal a delayed copy of itself $$y[n]=ax[n]+(1-a)*x[n+d(n)],\ 1>a>0 \qquad (1)$$

For echo the delay d(n)=D, which essentially means that delay is constant. Note that although the equation (1) is noncausal the actual system can be made causal by adding an overall delay.

More interesting audio effects, such as flanging, chorus and reverberation can be created by allowing the delay d(n) to vary in time e.g.

$$d(n)=D/2\sin(w_o n)$$

Therefore, the delay keeps oscillating between −D/2 and D/2, about the centre point. For the simple implementations of (1) the effect is like two singers—the lead singer sings normally while the other singer keeps racing up and down.

Consider the delay modulator (also known as vibrato)

$$y(n)=x[n+d(n)]$$

in (1). It essentially attempts to perform non-uniform sampling of the signal x(t) i.e.

$$y[n]=x(\{n+D/2\sin(w_o n)\}T_s)$$

Since the only information about x(t) that is available to the system is that of values at discrete times $nT_s$, some forms of interpolation is required to compute y[n]. The simplest approach is to use linear, cubic or lagrange interpolation $$\sum_{k=-N}^{N}\left[x[n'-k]\left(\prod_{\substack{i\neq k\\ i=-N}}^{N}\frac{\Delta t/T_s-i}{k-i}\right)\right],$$

$$n'=1NT(n+D/2\sin(w_o n))$$

and $$\Delta t=[n+D/2\sin(w_o n)]T_s-nT_s$$

What these interpolation methods overlook is the aliasing resulting from sampling below the Nyquist limit.

Consider the instantaneous sampling frequency ($1/T_{isf}$) at time $nT_s+\Delta t$ $$\begin{aligned}T_{isf}&=\{n+D/2\sin(w_o n)\}T_s-\{n-1+D/2\sin(w_o(n-1)\}T_s\\&=\{1+D/2\sin w_o\cos(2n-1)w_o\}T_s\end{aligned}$$

To remove aliasing errors from the interpolated signal, the signal x[n] should be first bandlimited to $\frac{1}{2}T_{isf}$. The interpolation and filtering however can be combined into one operation by using the analog reconstruction filter model. We now show how this is possible.

We know from sampling theorem that the signal x(t), bandlimited to F/2, can be reconstructed from its samples $x(nT_s)$ as $$x(t)=1/F_s\int_{-F_s/2}^{F_s/2}\left[\sum_{-\infty}^{\infty}x[n]e^{-j2\pi Fn/F_s}\right]e^{j2\pi Ft}\,dF$$

Since the new sampling frequency is $F_{isf}=1/T_{isf}$ (and if $F_{isf}<F_1$) the limit in the above equation should be changed accordingly, thus leading to $$x_c(t)=1/F_s\int_{-F_{isf}/2}^{F_{isf}/2}\left[\sum_{-\infty}^{\infty}x[n]e^{-j2\pi Fn/F_s}\right]e^{j2\pi Ft}\,dF$$

Upon simplification the above Eq leads to $$x_c(t)=\sum_{-\infty}^{\infty}x[n]\left[\frac{\sin[(\pi 1-nT_s)/T_{isf}]}{x(t-nT_s)/T_s}\right]$$

Finally, the summation must be limited to a finite range, for practical implementation. Therefore $$y[n]=x_c(n'T_s+\Delta t)$$

evaluated by considering 2N+1 sample points (x[n]) about nTs, is equivalent to $$y[n]=\sum_{k=-N}^{N}x[n'-k]\left[\frac{\sin[(\pi\Delta 1-kT_s)/T_{isf}]}{\pi(\Delta t-kT_s)/T_s}\right]$$

In the above example the modulating function was the sinusoidal sin $w_o$n. If a general modulating function g(n) is used the above formulation still works with the definition of the instantaneous sampling frequency as ($1/T_{isf}$) as $$T_{isf}=(1+g(n)-g(n-1)]T_s$$

The invention claimed is:

1. A method of aliasing cancellation is an audio effects algorithm using a delay modulated signal, derived from interpolation of a delay modulator at an instantaneous sampling frequency, comprising:

determining the instantaneous sampling frequency $1/T_{isf}$; and band limiting an input signal, to which the audio effects algorithm is to be applied, to ½ $T_{isf}$ prior to interpolation.

2. The method of claim 1, wherein the delay modulated signal of a sampled version x[n] of the band limited analogue signal x(t) is expressed as $$y[n]=x(\{n+D/2\sin(w_o n)\}T_s)$$

where n=integer

D=maximum delay $W_o$=oscillating frequency of the delay modulator; and $T_s$=1/sampling frequency.

3. The method of claim 2, wherein interpolation of the delay modulated signal y[n] is computed using $$y[n]=\sum_{k^m-N}^{N}x[n'-k]\left[\frac{\sin[\pi\Delta 1-kT_s/T_{isf}]}{\pi(\Delta t-kT_s)/T_s}\right]$$

$$n'=INT(n+D/2\sin(w_o n))$$

$$\Delta t=[n+D/2\sin(w_o n)]T_s-n'T_s.$$

4. The method of claim 1, wherein the instantaneous sampling frequency for a generalised modulating function g(n) is derived from $T_{isf}$-[1+g(n)−g(n−1)]$T_s$.

5. A method of aliasing cancellation, comprising:

determining the instantaneous sampling frequency $1/T_{isf}$ for an analogue input signal x(t);

band limiting the analogue input signal x(t) to $\frac{1}{2}T_{isf}$, and deriving a delay modulation signal of a sampled version x[n] of the band limited analogue signal by using the expression $$y[n]=x(\{n+D/2\sin(w_o n)\}T_s)$$

where n=integer

D=maximum delay $w_o$=oscillating frequency of the delay modulator; and $T_s$=1/sampling frequency.

6. A method of aliasing cancellation, comprising:

determining the instantaneous sampling frequency $1/T_{isf}$ for an analogue input signal x(t);

band limiting the analogue input signal x(t) to $\frac{1}{2}T_{isf}$; and deriving a delay modulation signal of a sampled version x[n] of the band limited analogue signal by using the expression $$y[n]=x(n+D/2\sin(w_o n))\}T_s)$$

interpolating the delay modulation signal by using $$y[n] = \sum_{k^m-N}^{N} x[n'-k]\left[\frac{\sin[\pi\Delta 1 - kT_s/T_{isf}]}{\pi(\Delta t - kT_s)/T_s}\right]$$

$$n' = INT(n + D/2\sin(w_o n))$$

$$\Delta t = [n + D/2\sin(w_o n)]T_s - n'T_s$$

where n=integer

D=maximum delay $w_o$=oscillating frequency of the delay modulator; and $T_s$=1/sampling frequency.

7. A method of aliasing cancellation, comprising:

determining the instantaneous sampling frequency $1/T_{isf}$ for an analogue input signal x(t);

band limiting the analogue input signal x(t) to $\frac{1}{2}T_{isf}$; and deriving a delay modulation signal of a sampled version x[n] of the band limited analogue signal by using the expression $$y[n]=x(\{n+D/2\sin(w_o n)\}T_s),$$

wherein the instantaneous sampling frequency, for a generalised modulating function g(n) is derived from $$T_{isf}=[1+g(n)-g(n-1)]T_s$$

where n=integer

D=maximum delay $w_o$=oscillating frequency of the delay modulator; and $T_s$=1/sampling frequency.

8. A method of aliasing cancellation, comprising:

determining the instantaneous sampling frequency $1/T_{isf}$ for an analogue input signal x(t);

band limiting the analogue input signal x(t) $\frac{1}{2}T_{isf}$; and deriving a delay modulation signal of a sampled version x[n] of the band limited analogue signal by using the expression $$y[n]=x(\{n+D/2\sin(w_o n)\}T_s)$$

interpolating the delay modulation signal by using $$y[n] = \sum_{k^m-N}^{N} x[n'-k]\left[\frac{\sin[\pi\Delta 1 - kT_s/T_{isf}]}{\pi(\Delta t - kT_s)/T_s}\right]$$

$$n' = INT(n + D/2\sin(w_o n))$$

$$\Delta t = [n + D/2\sin(w_o n)]T_s - n'T_s$$

wherein the instantaneous sampling frequency, for a generalised modulating function g(n) is derived from $$T_{isf}=[1+g(n)-g(n-1)T_s$$

where n=integer

D=maximum delay $w_o$=oscillating frequency of the delay modulator; and $T_s$=1/sampling frequency.

9. An audio signal device for generating audio effects, comprising:

a digital signal processor configured to perform the following functions:

determining the instantaneous sampling frequency $1/T_{isf}$ for an analogue input signal x(t);

band limiting the analogue input signal x(t) to ½ $T_{isf}$; and deriving a delay modulation signal of a sampled version x[n] of the band limited analogue signal by using the expression $$y[n]=x(\{n+D/2\sin(w_o n)\}T_s)$$

wherein n=integer

D=maximum delay $w_o$=oscillating frequency of the delay modulator; and $T_s$=1/sampling frequency.

10. An audio signal device for generating audio effects, comprising:

a digital signal processor configured to effect aliasing cancellation in an audio effects algorithm using the following steps:

determining the instantaneous sampling frequency $1/T_{isf}$ for an analogue input signal x(t);

band limiting the analogue input signal x(t) to ½ $T_{isf}$; and deriving a delay modulation signal of a sampled version x[n] of the band limited analogue signal by using the expression $$y[n]=x(\{n+D/2\sin(w_o n)\}T_s)$$

interpolating the delay modulation signal by using $$y[n] = \sum_{k^m-N}^{N} x[n'-k]\left[\frac{\sin[\pi\Delta 1 - kT_s/T_{isf}]}{\pi(\Delta t - kT_s)/T_s}\right]$$

$$n' = INT(n + D/2\sin(w_o n))$$

$$\Delta t = [n + D/2\sin(w_o n)]T_s - n'T_s$$

wherein the instantaneous sampling frequency for a generalised modulating function g(n) is derived from $$T_{isf}=[1+g(n)-g(n-1)]T_s$$

where n=integer

D=maximum delay $w_o$=oscillating frequency of the delay modulator; and $T_s$=1/sampling frequency.

* * * * *

UNITED STATES PATENT AND TRADEMARK OFFICE
CERTIFICATE OF CORRECTION

PATENT NO. : 7,359,521 B1 
APPLICATION NO. : 10/148095
DATED : April 15, 2008
INVENTOR(S) : Mohammed Javed Absar et al.

It is certified that error appears in the above-identified patent and that said Letters Patent is hereby corrected as shown below:

<u>Column 4</u>
Line 18, "A method of aliasing cancellation is an audio effects algorithm" should read as -- A method of aliasing cancellation in an audio effects algorithm --

Line 50, "g(n) is derived from $T_{isf}$–[1+g(n)–g(n-1)]$T_s$" should read as -- g(n) is derived from $T_{isf}$=[1+g(n)–g(n-1)]$T_s$ --

Line 54, "input signal x(t) to ½ $T_{isf}$, and" should read as -- input signal x(t) to ½ $T_{isf}$; and --

Line 59, "y[n] = x({n+D/2sin($w_o$n)}$T_s$)" should read as
-- y[n] = x({n+D/2sin($w_0$n)}$T_s$), --

<u>Column 5</u>
Line 5, "y[n] = x(n+D/2sin($w_o$n)}$T_s$)" should read as
-- y[n] = x({n+D/2sin($w_0$n)}$T_s$), --

Line 45, "y[n] = x({n+D/2sin($w_o$n)}$T_s$" should read as
-- y[n] = x({n+D/2sin($w_0$n)}$T_s$), --

Line 54, "Δt = [n+D/2sin($w_o$n)]$T_s$ – n'$T_s$" should read as
-- Δt = [n+D/2sin($w_0$n)]$T_s$ – n'$T_s$ --

<u>Column 6</u>
Line 4, "$T_{isf}$ = [1+g(n) – g(n-1)Ts" should read as -- $T_{isf}$ = [1+g(n) – g(n-1)]Ts --

Line 36, "y[n] = x({n+D/2sin($w_o$n)}$T_s$)" should read as
-- y[n] = x({n+D/2sin($w_0$n)}$T_s$), --

UNITED STATES PATENT AND TRADEMARK OFFICE
CERTIFICATE OF CORRECTION

PATENT NO. : 7,359,521 B1
APPLICATION NO. : 10/148095
DATED : April 15, 2008
INVENTOR(S) : Mohammed Javed Absar et al.

It is certified that error appears in the above-identified patent and that said Letters Patent is hereby corrected as shown below:

<u>Column 6</u>
Line 45, "$\Delta t = [n+D/2\sin(w_o n)]T_s - n'T_s$ " should read as
-- $\Delta t = [n+D/2\sin(w_0 n)]T_s - n'T_s$ --

Signed and Sealed this

Nineteenth Day of August, 2008

JON W. DUDAS
*Director of the United States Patent and Trademark Office*